United States Patent
Rivoire et al.

(10) Patent No.: US 9,865,545 B2
(45) Date of Patent: Jan. 9, 2018

(54) PLURALITY OF SUBSTRATES BONDED BY DIRECT BONDING OF COPPER RECESSES

(71) Applicants: STMicroelectronics (Crolles 2) SAS, Crolles (FR); Commissariat A L'Energie Atomique et aux Energies Alternatives, Paris (FR)

(72) Inventors: Maurice Rivoire, Meylan (FR); Viorel Balan, La Buisse (FR)

(73) Assignees: STMicroelectronics (Crolles 2) SAS, Crolles (FR); Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 15/447,410

(22) Filed: Mar. 2, 2017

(65) Prior Publication Data

US 2017/0179035 A1    Jun. 22, 2017

Related U.S. Application Data

(62) Division of application No. 14/706,579, filed on May 7, 2015, now Pat. No. 9,620,385.

(30) Foreign Application Priority Data

May 21, 2014    (FR) ..................... 14 54578

(51) Int. Cl.
*H01L 23/34*    (2006.01)
*H01L 21/00*    (2006.01)
(Continued)

(52) U.S. Cl.
CPC .. *H01L 23/53238* (2013.01); *H01L 21/30625* (2013.01); *H01L 21/7684* (2013.01);
(Continued)

(58) Field of Classification Search
CPC ........... H01L 23/53238; H01L 23/5226; H01L 21/30625; H01L 21/7684; H01L 21/76843; H01L 25/0657; H01L 24/06
See application file for complete search history.

(56) References Cited

U.S. PATENT DOCUMENTS 6,812,141 B1    11/2004  Gaidis et al.
6,927,113 B1     8/2005  Sahota et al.
(Continued)

FOREIGN PATENT DOCUMENTS

CN       102915962 A     2/2013
WO    WO-2012010662      1/2012

OTHER PUBLICATIONS

INPI Search Report and Written Opinion for FR 1454578 dated Aug. 28, 2014 (8 pages).

*Primary Examiner* — Alonzo Chambliss
(74) *Attorney, Agent, or Firm* — Gardere Wynne Sewell LLP (57) ABSTRACT

A structure includes a substrate having an upper surface provided with recesses and coated with a continuous barrier layer topped with a continuous copper layer filling at least the recesses. The structure is planarized by a chemical-mechanical polishing of the copper, such a polishing being selective with respect to the barrier layer so that copper remains in the recesses and is coplanar with the upper surface of the substrate. Two such structures are then direct bonded to each other (copper to copper) with opposite areas having a same topology.

12 Claims, 5 Drawing Sheets

(51) Int. Cl.
  *H01L 23/532*  (2006.01)
  *H01L 21/768*  (2006.01)
  *H01L 21/306*  (2006.01)
  *H01L 23/522*  (2006.01)
  *H01L 25/065*  (2006.01)
  *H01L 23/00*  (2006.01)

(52) U.S. Cl.
  CPC .... *H01L 21/76843* (2013.01); *H01L 23/5226* (2013.01); *H01L 24/06* (2013.01); *H01L 25/0657* (2013.01); *H01L 2225/06544* (2013.01)

(56) References Cited

U.S. PATENT DOCUMENTS

| | | | |
|---|---|---|---|
| 6,979,625 B1 | 12/2005 | Woo et al. | |
| 9,620,385 B2 * | 4/2017 | Rivoire | H01L 21/3212 |
| 2007/0018332 A1 | 1/2007 | Ueno | |
| 2008/0268614 A1 * | 10/2008 | Yang | H01L 21/2007 438/455 |
| 2015/0243611 A1 * | 8/2015 | Liu | H01L 24/06 257/751 |

* cited by examiner

PLURALITY OF SUBSTRATES BONDED BY DIRECT BONDING OF COPPER RECESSES

CROSS REFERENCE TO RELATED APPLICATIONS

This application is a divisional application from U.S. application patent Ser. No. 14/706,579 filed May 7, 2015, which claims the priority benefit of French Patent application number 1454578, filed on May 21, 2014, the disclosures of which are hereby incorporated by reference in their entireties.

TECHNICAL FIELD

The present disclosure relates to a method of planarizing a structure comprising a surface provided with recesses filled with copper.

BACKGROUND

In various applications, a planarized structure comprising recesses filled with copper is desired to be formed. In an example of application, it is provided to assemble face-to-face two chips or integrated circuit wafers, each having such a surface planarized so that the chips or wafers can be coupled by direct copper-to-copper bonding. Direct bonding means any bonding performed with no addition of adhesive material. Such a bonding may be performed at ambient temperature or not, and may be assisted or not by an external compression. If no thermo-compression is used, the constraints in terms of evenness of the surfaces to be assembled are significant to obtain a satisfactory bonding.

A structure comprising a surface provided with recesses filled with copper flush with this surface is generally formed by etching the recesses, by filling the recesses with copper, and by planarizing the surface of the structure so that the copper is flush with this surface.

FIGS. 1A to 1D are copies of FIGS. 1A to 1D of French Patent No. FR2947481 (incorporated by reference) which describes successive steps of such a planarizing method, in the case of recesses having widths in the order of 10 µm.

Figure 1A:
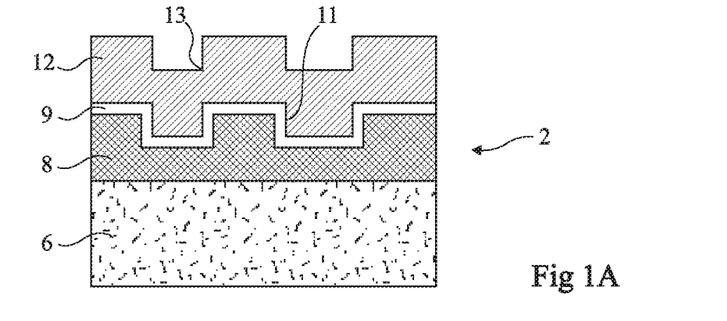
FIGS. 1A to 1D, previously described, are copies of FIGS. 1A to 1D of patent application FR2947481.

FIG. 1A shows a structure 2 before planarization. The structure comprises a silicon wafer 6 covered with a silicon oxide layer 8 having recesses 11 etched into it. A titanium nitride diffusion barrier layer 9 has then been deposited on silicon oxide layer 8 and a copper layer 12 has been formed on the barrier layer so that copper 12 fills recesses 11. At this step, the upper surface of the copper comprises steps 13.

Figure 1B:
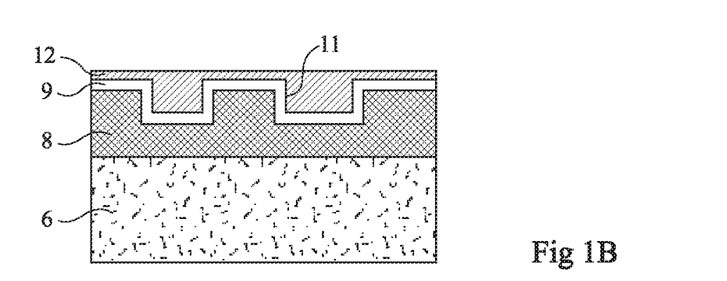
Figure 1C:
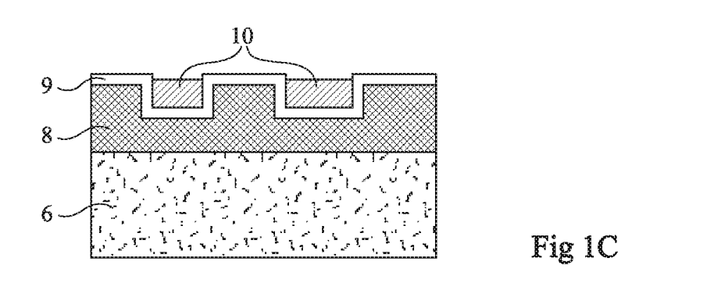

FIG. 1B shows the structure of FIG. 1A after a first polishing step providing a planar upper surface of copper 12. To achieve this, a chemical-mechanical polishing (CMP) with a planarizing product is carried out. FIG. 1C shows the structure of FIG. 1B after a second polishing step to remove the copper supported by the upper surface of barrier layer 9 and to leave in place copper pads 10 in recesses 11. This second polishing step has been carried out by a chemical-mechanical polishing with a product selectively etching copper over barrier layer 9.

Figure 1D:
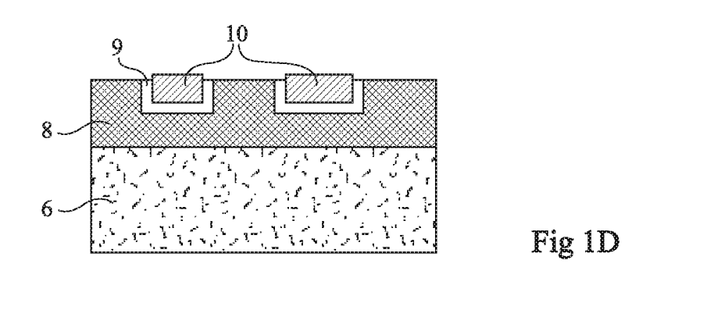

FIG. 1D shows the structure of FIG. 1C after the removal, by a chemical-mechanical polishing, of barrier layer 9 arranged on either side of pads 10.

The method described in relation with FIGS. 1A to 1D appears not to provide the desired results when the dimensions of the recesses and/or of the spaces between these recesses become smaller than 5 µm, and more particularly when these dimensions become smaller than 1 µm.

SUMMARY

In an embodiment, an apparatus comprises: a first substrate having a first surface and including first recesses extending into the first substrate from said first surface, said first recesses coated with a first barrier layer and filled with copper having an upper surface coplanar with the first surface of the first substrate; and a second substrate having a second surface and including second recesses extending into the second substrate from said second surface, said second recesses coated with a second barrier layer and filled with copper having an upper surface coplanar with respect the second surface; wherein the first and second substrates are assembled with the first surface facing the second surface by direct bonding of the copper upper surfaces of the filled first recesses in the first substrate to corresponding copper upper surfaces of the filled second recesses in the second substrate.

In an embodiment, a face-to-face assembly is made of a first wafer and second wafer. The first wafer includes a first layer having a first surface and including first recesses extending into the first layer from said first surface, said first recesses coated with a first barrier layer and filled with copper having an upper surface coplanar with the first surface. The second wafer includes a second layer having a second surface and including second recesses extending into the second layer from said second surface, said second recesses coated with a second barrier layer and filled with copper having an upper surface coplanar with the second surface. The first wafer is attached to the second wafer by direct bonding of the copper upper surfaces of the filled first recesses in the first layer to corresponding copper upper surfaces of the filled second recesses in the second layer.

In an embodiment, a face-to-face assembly is made of a first chip and second chip. The first chip includes a first layer having a first surface and including first recesses extending into the first layer from said first surface, said first recesses coated with a first barrier layer and filled with copper having an upper surface coplanar with the first surface. The second chip includes a second layer having a second surface and including second recesses extending into the second layer from said second surface, said second recesses coated with a second barrier layer and filled with copper having an upper surface coplanar with the second surface. The first chip is attached to the second chip by direct bonding of the copper upper surfaces of the filled first recesses in the first layer to corresponding copper upper surfaces of the filled second recesses in the second layer.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION OF THE DRAWINGS

For clarity, the same elements have been designated with the same reference numerals in the various drawings and, further, the various drawings are not to scale.

Figure 2:
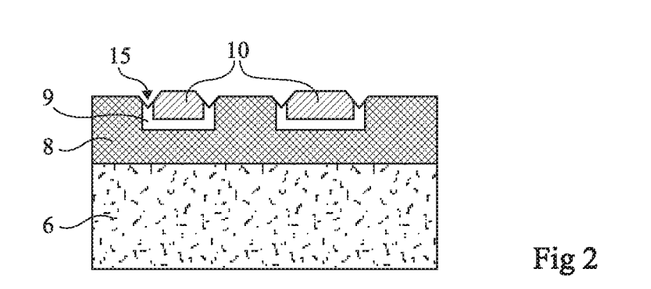
FIG. 2 is a simplified cross-section view showing a structure obtained after the implementation of the planarizing method described in relation with FIGS. 1A to 1D.

FIG. 2 is a simplified cross-section view showing a structure of the type in FIG. 1C after the chemical-mechanical polishing step described in relation with FIG. 1D has been performed. In this structure, the dimensions of the recesses and of the spaces between recesses are smaller than 5 μm. It can be observed that peripheral holes 15 appear, at the edge of the copper of pads 10. Such holes have a depth which may be in the range from 1 to 50 nm and a width which may be in the range from 1 nm to a plurality of μm.

Figure 3A:
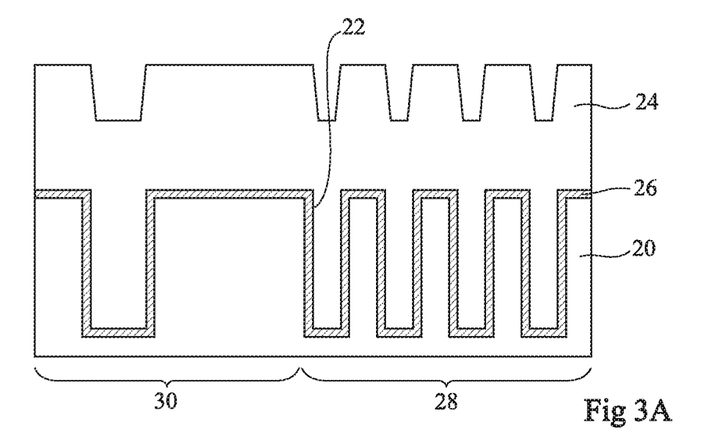
FIGS. 3A and 3B are simplified cross-section views showing, at a nanometric scale, a structure before and after the application of the planarization method described in relation with FIGS. 1A to 1D.
Figure 3B:
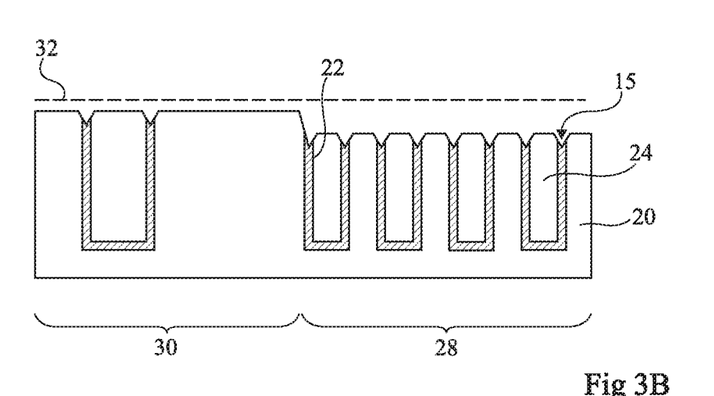

FIGS. 3A and 3B show an example of a structure comprising, in a substrate 20, recesses 22 filled with copper 24 with an interposed barrier layer 26, respectively before and after the application of the planarization method described in relation with FIGS. 1A to 1D. In these drawings and in the next drawings, "substrate" designates the material having the recesses formed therein. Substrate 20 may be an insulating layer, for example, a silicon oxide layer deposited on a support or an underlying stack. Barrier layer 26 for example is a tantalum layer coated with tantalum nitride having a thickness which may be in the range from 1 to 100 nm, preferably from 10 to 20 nm, for example, equal to 15 nm.

The structure as shown comprises two regions:
a region 28 with a high density of recesses 22, on the right-hand side of the drawings, where recesses 22 form a network of recesses, the network recesses being spaced apart from one another by less than 5 μm, and
a region 30 with a low density of recesses 22, on the left-hand side of the drawings, where a recess 22 having a non-critical width in the range from 10 nm to 1 mm is spaced apart by at least 5 μm from neighboring recesses.

In FIG. 3A, copper 24 has been deposited over the entire structure and forms a layer having the bottom of its lower portions, opposite to recesses 22, located above the upper surface of barrier layer 26.

In FIG. 3B, a dotted line 32 illustrates the level of the upper surface of the structure in the case of an ideal planarization. In practice, as shown in this drawing, the upper surface of the structure after planarization by chemical-mechical polishing has, at a nanometric scale, many defects, which may include:
peripheral holes 15 at the border of copper 24 filling recesses 22, and
a general erosion of the upper surface of the structure, this erosion being greater in recess-dense region 28 than in region 30 with a low recess density.

It can be observed that the erosion of the upper surface of the structure increases when the dimensions of the recesses and of the spaces between these recesses decrease. As an example, the interval between line 32 and the upper surface of recess-dense region 28 may be greater than 10 nm. For example, for recesses having a 3 μm width, the interval is approximately 15 nm in the case where the space between recesses is 3 μm, and approximately 50 nm in the case where the space between recesses is 1 μm.

Such defects at the surface of the structure raise serious technological issues, for example, in the case of an assembly of two chips by direct copper-to-copper bonding.

It would thus be desirable to have a method of planarizing a structure of the type in FIG. 1A or 3A, such that the above-mentioned defects (peripheral holes and erosion of the upper surface) are suppressed.

Figure 4A:
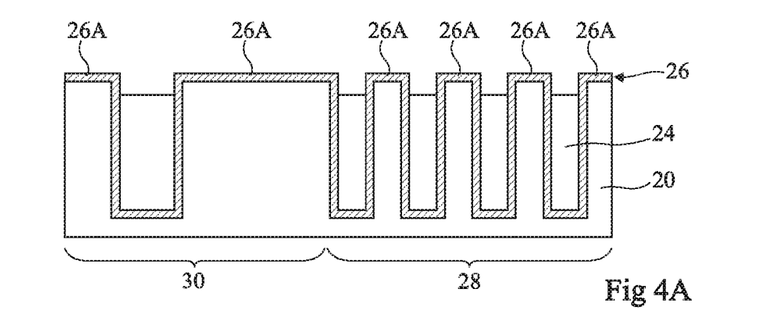
FIGS. 4A to 4C are simplified cross-section views illustrating an embodiment of a planarization method.
Figure 4B:
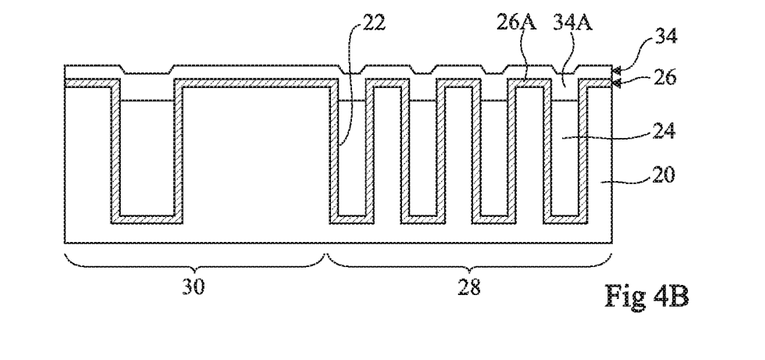
Figure 4C:
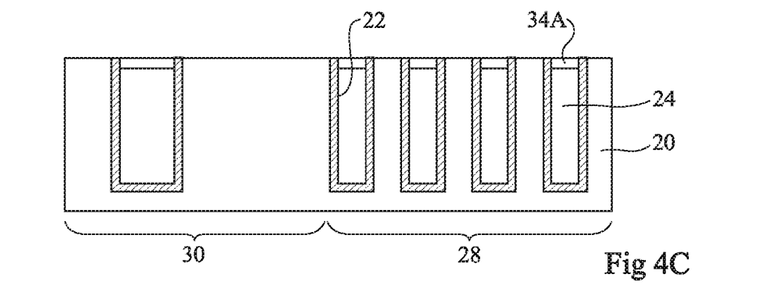

FIGS. 4A to 4C illustrate an embodiment of successive steps of planarization of a structure of the type in FIG. 3A.

FIG. 4A shows the structure of FIG. 3A after having carried out the planarization steps described in relation with FIGS. 1B and 1C, that is, after a planarizing chemical-mechanical polishing etching copper 24 selectively over barrier layer 26. In this embodiment, the chemical-mechanical polishing is performed so that copper 24 filling recesses 22 is set back with respect to the lower surface level of upper portions 26A of barrier layer 26. The interval between the lower surface of portions 26A and the upper surface of copper 24 is at least of a few tenths of a nanometer, for example, 1 nm. It may range up to from 5 to 100 nm, according to the desired final profile, as will be seen hereafter. As will be seen hereafter, this interval will enable to protect copper 24 during the step of removing upper portions 26A of barrier layer 26. Optionally, a step of dry selective etching of copper may be carried out at this stage to slightly increase this interval.

At the step illustrated in FIG. 4B, a material 34 has been deposited. Thus, at the level of each recess 22, the upper surface of copper 24 is coated with a portion 34A of material 34. The minimum thickness of material 34 is such that it protects copper 24 on all areas. Thus, portions 34A reach a level greater than that of the upper surface of portions 26A of the barrier layer. The thickness of material 34 may be in the range from 1 to 100 nm, for example, 15 nm. Material 34 is selected so that it can be polished at the same time as the material forming barrier layer 26 and that, given the interval between the lower surface of portions 26A and the upper surface of copper 24, it remains at least partially present over the entire copper surface during the subsequent step of removing upper portions 26A of barrier layer 26. It thus protects the copper during this entire step. As an example, for a tantalum barrier layer 26 coated with tantalum nitride, material 34 may be titanium, titanium nitride, tantalum, tantalum nitride, molybdenum, silicon oxide or nitride.

At the step illustrated in FIG. 4C, the upper surface of the structure has been planarized by chemical-mechanical polishing to expose substrate 20 while maintaining a residue of material 34 over the entire copper surface. Thus, portions 26A of barrier layer 26 have been removed while the copper was protected by material 34. The upper surface of each portion 34A coating the top of copper 24 of recesses 22 is flush with the exposed surface of substrate 20. As an example, after this step, the thickness of portions 34A is in the range from 1 to 100 nm, for example, 10 nm.

According to a first alternative embodiment, it may be stopped at the step described in relation with FIG. 4C while leaving in place portions 34A.

Figure 5A:
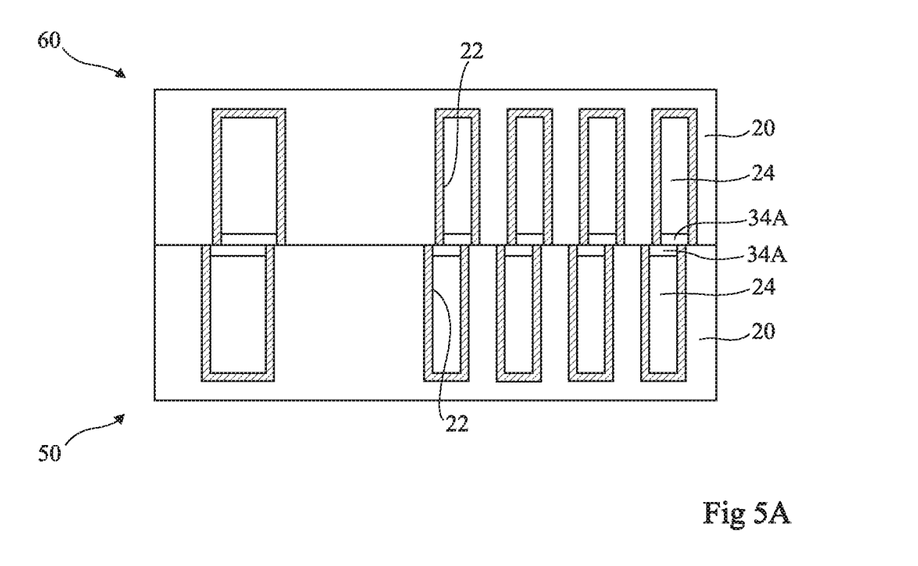
FIG. 5A shows two structures such as that in FIG. 4C, next to each other.

As illustrated in FIG. 5A, this first variation enables to bond materials 34 of two chips or wafers 50 and 60 of the same type. In this case, material 34 will have been selected to be electrically conductive and to exhibit a diffusion barrier effect for copper. Thus, in case of a misalignment between the two chips or wafers 50 and 60, as shown, there will be no diffusion of copper from a pad 24 into the dielectric of the substrate located opposite thereto.

In a second alternative embodiment, the method described in relation with FIGS. 4A to 4C is followed by an additional chemical-mechanical polishing step with a planarizing chemical to remove portions 34A.

Figure 4D:
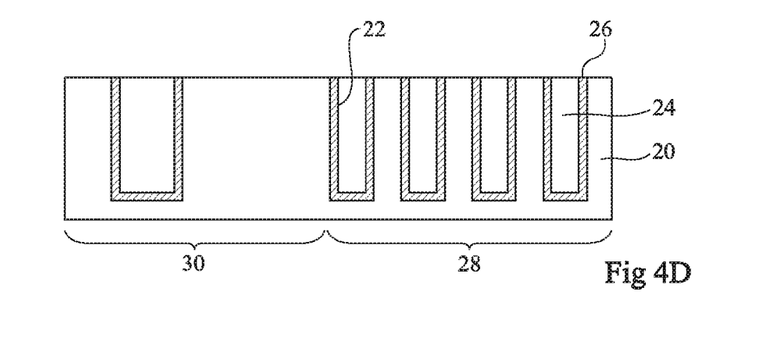
FIG. 4D is a simplified cross-section view illustrating an additional step of the method described in relation with FIGS. 4A to 4C.

FIG. 4D shows the structure of FIG. 4C after this additional chemical-mechanical polishing step has been carried out, the polishing having been stopped on the upper surface of copper 24 filling recesses 22 (or under this surface) so that the exposed surface of copper 24 is eventually flush with the upper surface of substrate 20. Thus, as compared with the case of the structure of FIG. 4C, there are no portions 34A of material 34 at the top of copper 24 filling recesses 22. In this second variation, material 34, which is finally removed, may be a dielectric, as indicated hereabove.

The structure of FIGS. 4C and 4D has an upper surface with no peripheral holes 15 at the border of material 34 or of copper 24 generated by the chemical-mechanical polishing whatever the dimensions of the recesses and of the intervals between recesses. Further, in such structures, the upper surface of recess-dense region 28 is at the same level as the upper surface of the region having a low recess density 30.

Figure 5B:
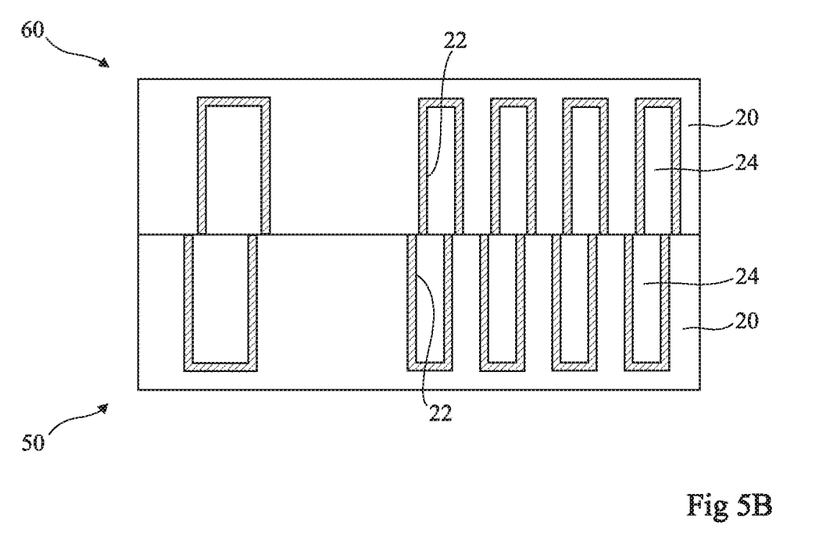
FIG. 5B shows two structures such as that shown in FIG. 4D, bnext to each other.

The implementation of the planarizing method described in relation with FIGS. 4A to 4C, or of its variation described in relation with FIGS. 4A to 4D, provides structures having a planar upper surface, where level differences between different regions of this surface do not exceed 5 nm, or even 2 nm. Such structures may for example be assembled on each other by direct bonding of material 34 (see, FIG. 5A) or of copper 24 (see, FIG. 5B) flush with the surface of one of the structures with material 34 or copper 24 flush with the surface of the other structure.

Specific embodiments have been described. Various alterations, modifications, and improvements will readily occur to those skilled in the art. In particular, although the structure described in relation with FIGS. 3A, 3B, and 4A to 4D comprises two regions 28 and 30 provided with recesses of different dimensions and by different numbers, the number, the dimensions, the arrangement, and the topology of the recesses may be selected by those skilled in the art. For example, recesses crossing substrate 20 may be formed. The topology of the recesses may be adapted to form, for example, pads, vias, or metal connection lines.

It will be within the abilities of those skilled in the art to select, for the various layers described in relation with FIGS. 4A to 4D, other materials than those indicated as an example. In particular, the material of barrier layer 26 indicated as being tantalum coated with tantalum nitride may be replaced with other materials selected from the group comprising titanium coated with titanium nitride, tungsten, chromium, ruthenium, molybdenum, and cobalt. Further, in the case of the second variation, the material of layer 34 may be a dielectric, for example, silicon oxide or nitride with carbon and/or porous compounds. Further, layer 34 may be formed of several layers of the previously-mentioned materials. Further, although recesses in a silicon oxide substrate 20 have been described, other dielectric materials may be used, in particular, silicon nitride, silicon oxide with porous or non-porous carbon compounds, glass, polymers, and other organic compounds.

Although an embodiment of successive steps of a planarization method has been described, the number and/or the order of these steps may be modified. For example, to obtain the structure of FIG. 4D, the steps described in relation with FIGS. 4C and 4D will preferably be carried out during one and the same chemical-mechanical planarizing polishing, stopping on the upper surface of copper 24 filling recesses 22.

It will be within the abilities of those skilled in the art to implement the chemical-mechanical polishing methods described herein in known fashion. They may for example use Ebara's FREX300S or Applied Materials' Reflexion Low K industrial equipment. The copper polishing will for example be performed on a Dow Chemical IC1000 fabric and Fujimi's Cu DCM-C74 product. The barrier will preferably be polished with product Cabot B7001 on a Cabot D200 fabric.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. An apparatus, comprising:
a first substrate having a first surface and including first recesses extending into the first substrate from said first surface, said first recesses coated with a first barrier layer and filled with copper having an upper surface that is coplanar with the first surface of the first substrate and lacking any erosion holes at a border of the copper and the first barrier layer; and
a second substrate having a second surface and including second recesses extending into the second substrate from said second surface, said second recesses coated with a second barrier layer and filled with copper having an upper surface that is coplanar with respect the second surface of the second substrate and lacking any erosion holes at a border of the copper and the second barrier layer;
wherein the first and second substrates are assembled with the first surface facing the second surface by direct bonding of the copper upper surfaces of the filled first recesses in the first substrate to corresponding copper upper surfaces of the filled second recesses in the second substrate.

2. The apparatus of claim 1, wherein the first and second barrier layers are each made of a material selected from the group consisting of: titanium, tantalum, titanium nitride and tantalum nitride, cobalt, and molybdenum.

3. The apparatus of claim 1, wherein each of the first and second substrates comprises an insulating layer including said recesses.

4. The apparatus of claim 3, wherein said insulating layer is a silicon oxide layer.

5. A face-to-face assembly of a first wafer and second wafer, wherein the first wafer includes a first layer having a first surface and including first recesses extending into the first layer from said first surface, said first recesses coated with a first barrier layer and filled with copper having an upper surface that is coplanar with the first surface and lacking any erosion holes at a border of the copper and the first barrier layer, wherein the second wafer includes a second layer having a second surface and including second recesses extending into the second layer from said second surface, said second recesses coated with a second barrier layer and filled with copper having an upper surface that is coplanar with the second surface and lacking any erosion holes at a border of the copper and the second barrier layer, wherein the first wafer is attached to the second wafer by direct bonding of the copper upper surfaces of the filled first recesses in the first layer to corresponding copper upper surfaces of the filled second recesses in the second layer.

6. The assembly of claim 5, wherein each of the first and second barrier layers is made of a material selected from the group consisting of: titanium, tantalum, titanium nitride and tantalum nitride, cobalt, and molybdenum.

7. The assembly of claim 5, wherein each of the first and second layers is an insulating layer.

8. The assembly of claim 7, wherein said insulating layer is a silicon oxide layer.

9. A face-to-face assembly of a first chip and second chip, wherein the first chip includes a first layer having a first surface and including first recesses extending into the first layer from said first surface, said first recesses coated with a first barrier layer and filled with copper having an upper surface that is coplanar with the first surface and lacking any erosion holes at a border of the copper and the first barrier layer, wherein the second chip includes a second layer having a second surface and including second recesses extending into the second layer from said second surface, said second recesses coated with a second barrier layer and filled with copper having an upper surface that is coplanar with the second surface and lacking any erosion holes at a border of the copper and the second barrier layer, wherein the first chip is attached to the second chip by direct bonding of the copper upper surfaces of the filled first recesses in the first layer to corresponding copper upper surfaces of the filled second recesses in the second layer.

10. The assembly of claim 9, wherein each of the first and second barrier layers is made of a material selected from the group consisting of: titanium, tantalum, titanium nitride and tantalum nitride, cobalt, and molybdenum.

11. The assembly of claim 9, wherein each of the first and second layers is an insulating layer.

12. The assembly of claim 11, wherein said insulating layer is a silicon oxide layer.

* * * * *